United States Patent
Zhao et al.

(10) Patent No.: US 11,721,403 B2
(45) Date of Patent: Aug. 8, 2023

(54) METHOD OF PROGRAMMING AND VERIFYING MEMORY DEVICE AND RELATED MEMORY DEVICE

(71) Applicant: YANGTZE MEMORY TECHNOLOGIES CO., LTD., Wuhan (CN)

(72) Inventors: XiangNan Zhao, Wuhan (CN); Yali Song, Wuhan (CN); An Zhang, Wuhan (CN); Hongtao Liu, Wuhan (CN); Lei Jin, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/164,795

(22) Filed: Feb. 1, 2021

(65) Prior Publication Data

US 2021/0158880 A1      May 27, 2021

Related U.S. Application Data

(63) Continuation of application No. 16/699,743, filed on Dec. 2, 2019, now Pat. No. 10,943,665, which is a
(Continued)

(51) Int. Cl.
     *G11C 16/06*      (2006.01)
     *G11C 16/34*      (2006.01)
     (Continued)

(52) U.S. Cl.
     CPC ...... *G11C 16/3481* (2013.01); *G11C 11/5628* (2013.01); *G11C 16/08* (2013.01);
     (Continued)

(58) Field of Classification Search
     CPC ........ G11C 16/3481; G11C 2211/5621; G11C 16/3459; G11C 16/12; G11C 11/5628; G11C 16/08
     See application file for complete search history.

(56) References Cited

U.S. PATENT DOCUMENTS

| | | | |
|---|---|---|---|
| 7,139,198 B2 | 11/2006 | Guterman | |
| 9,269,445 B1 * | 2/2016 | Abe | G11C 16/10 |

(Continued)

FOREIGN PATENT DOCUMENTS

| | | |
|---|---|---|
| CN | 1930632 A | 3/2007 |
| CN | 101681295 A | 3/2010 |

(Continued)

OTHER PUBLICATIONS

Extended European Search Report issued in corresponding European Application No. 19949340.4, dated May 30, 2022, 8 pages.

(Continued)

*Primary Examiner* — Uyen Smet
(74) *Attorney, Agent, or Firm* — Bayes PLLC

(57) ABSTRACT

When programming and verifying a memory device which includes a plurality of memory cells and a plurality of word lines, a first coarse programming is first performed on a first memory cell among the plurality of memory cells which is controlled by a first word line among the plurality of word lines, and then a second coarse programming is performed on a second memory cell among the plurality of memory cells which is controlled by a second word line among the plurality of word lines. Next, a first coarse verify current is used for determining whether the first memory cell passes a coarse verification and a second coarse verify current is used for determining whether the second memory cell passes a second coarse verification, wherein the second coarse verify current is smaller than the first coarse verify current.

16 Claims, 6 Drawing Sheets

Related U.S. Application Data continuation of application No. PCT/CN2019/111830, filed on Oct. 18, 2019.

(51) Int. Cl.
  *G11C 11/56* (2006.01)
  *G11C 16/08* (2006.01)
  *G11C 16/12* (2006.01)

(52) U.S. Cl.
  CPC .......... *G11C 16/12* (2013.01); *G11C 16/3459* (2013.01); *G11C 2211/5621* (2013.01)

(56) References Cited

U.S. PATENT DOCUMENTS

| | | | |
|---|---|---|---|
| 2008/0101126 A1 | 5/2008 | Hemink et al. | |
| 2008/0123426 A1 | 5/2008 | Lutze et al. | |
| 2008/0186780 A1* | 8/2008 | Ho | G11C 16/3459 365/185.29 |
| 2010/0128523 A1* | 5/2010 | Yip | G11C 16/3454 365/185.03 |
| 2012/0033500 A1* | 2/2012 | Dutta | G11C 16/0483 365/185.19 |
| 2013/0163343 A1* | 6/2013 | Yang | G11C 16/26 365/185.21 |
| 2014/0071765 A1 | 3/2014 | Ishii | |
| 2015/0003152 A1 | 1/2015 | Kwak et al. | |
| 2016/0027504 A1 | 1/2016 | Lee | |
| 2016/0078949 A1 | 3/2016 | Abe | |
| 2016/0099070 A1 | 4/2016 | Jiang et al. | |
| 2016/0314843 A1 | 10/2016 | Tseng et al. | |
| 2017/0098472 A1* | 4/2017 | Perner | G11C 11/5642 |
| 2017/0242632 A1 | 8/2017 | Cho | |
| 2017/0271025 A1 | 9/2017 | Suzuki et al. | |
| 2019/0088313 A1* | 3/2019 | Kondo | G11C 11/5642 |
| 2020/0005871 A1* | 1/2020 | Yang | G11C 8/12 |

FOREIGN PATENT DOCUMENTS

| | | |
|---|---|---|
| CN | 106067322 A | 11/2016 |
| CN | 107017028 A | 8/2017 |
| CN | 107123442 A | 9/2017 |
| CN | 110010185 A | 7/2019 |
| CN | 110085272 A | 8/2019 |
| CN | 110326047 A | 10/2019 |

OTHER PUBLICATIONS

Communication pursuant to Article 94(3) EPC issued in corresponding European Application No. 19 939 230.3, dated Feb. 14, 2023, 7 pages.

* cited by examiner

METHOD OF PROGRAMMING AND VERIFYING MEMORY DEVICE AND RELATED MEMORY DEVICE

CROSS REFERENCE TO RELATED APPLICATIONS

This application is a continuation of U.S. application Ser. No. 16/699,743, filed on Dec. 2, 2019, which is a continuation of International Application No. PCT/CN2019/111830, filed on Oct. 18, 2019, both of which are incorporated herein by reference in their entireties.

BACKGROUND

The present disclosure is related to a method of programming and verifying a memory device and related memory device, and more particularly, to a method of programming and verifying a memory device with 3D QLC structure and a related memory device.

Semiconductor memory has become more popular for use in various electronic devices. For example, non-volatile semiconductor memory is applied in cellular telephones, digital cameras, personal digital assistants, mobile computing devices, non-mobile computing devices and other devices. Recently, ultra high density storage devices have been proposed using a three-dimensional (3D) stacked memory structure sometimes referred to as a Bit Cost Scalable (BiCS) architecture. For example, a 3D NAND stacked flash memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers.

Each planar NAND memory consists of an array of memory cells connected by multiple word lines and bit lines. Data is programmed into or read from the planar NAND memory on a page-by-page basis. In order to mitigate the effect of floating gate-to-floating gate coupling, a 3D QLC NAND memory may be programmed through coarse and fine programming to improve overall programming speed. Also, a coarse/fine verify is performed according to a constant coarse/fine verify current after each step of coarse/fine programming to determine whether the selected memory cell has reached a desired value.

In a prior art coarse/fine programming method, the difference between the coarse verify current and the fine verify current is set in a way to result in a constant voltage difference on the current-voltage curve of a 3D QLC NAND memory device. As the 3D QLC NAND memory device adopts more layers, the difference between the best-of-current (BOC) case current-voltage curve and the worse-of-current (WOC) case current-voltage curve also increases, resulting in larger gain variations among different memory cells. Therefore, the prior art coarse/fine programming method has a small margin on the threshold voltages of the memory cells.

SUMMARY

The present invention provides a method of programming and verifying a memory device which includes a plurality of memory cells and a plurality of word lines. The method includes performing a first coarse programming on a first memory cell among the plurality of memory cells which is controlled by a first word line among the plurality of word lines, performing a second coarse programming on a second memory cell among the plurality of memory cells which is controlled by a second word line among the plurality of word lines after performing the first coarse programming on the first memory cell, determining whether the first memory cell passes a coarse verification according to a first coarse verify current, and determining whether the second memory cell passes a second coarse verification according to a second coarse verify current smaller than the first coarse verify current.

The present invention also provides a memory device which includes a memory array having a plurality of memory cells, a plurality of word lines, a word line driver and a controller. The controller is configured to perform a first coarse programming on a first memory cell controlled by a first word line among the plurality of word lines, perform a second coarse programming on a second memory cell controlled by a second word line among the plurality of word lines after performing the first coarse programming on the first memory cell, determine whether the first memory cell passes a coarse verification according to a first coarse verify current; and determine whether the second memory cell passes a second coarse verification according to a second coarse verify current smaller than the first coarse verify current.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
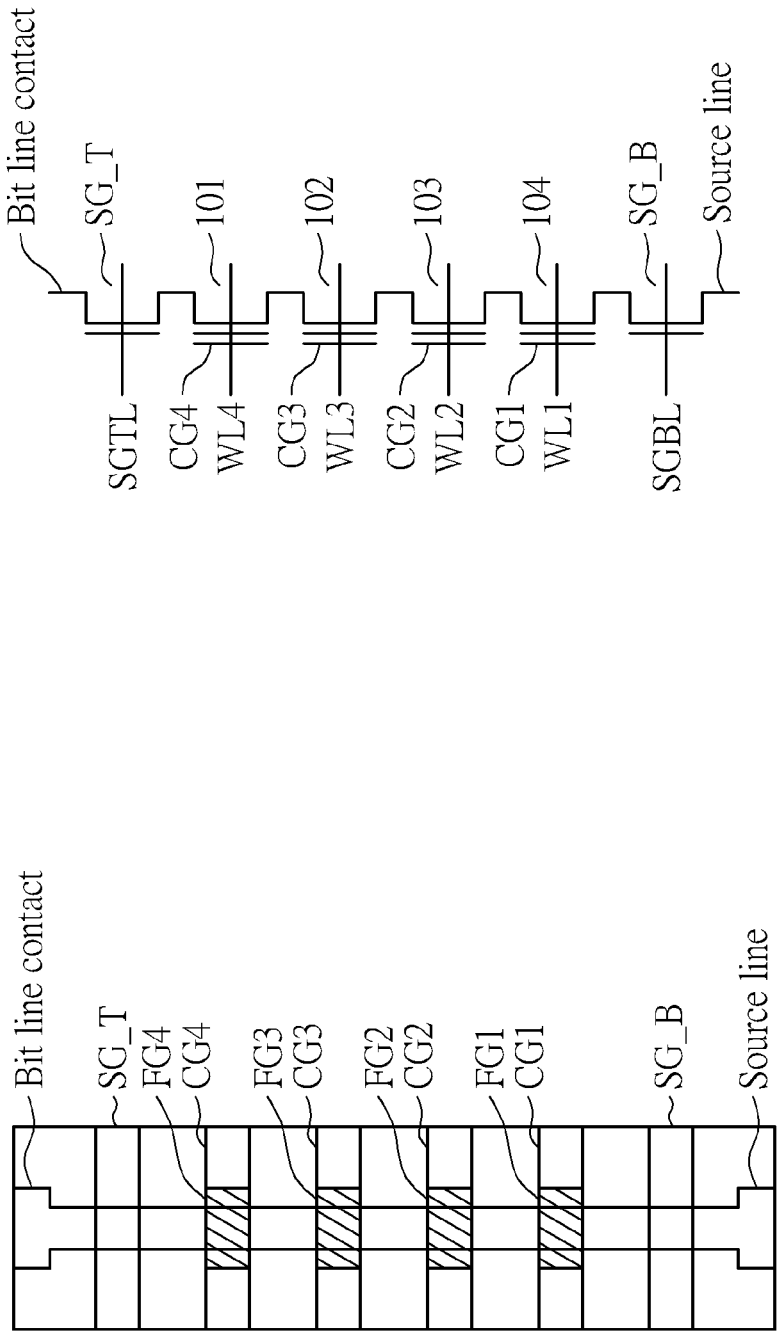
FIG. 1 is a top-view diagram illustrating one NAND string according to an embodiment of the present invention.
FIG. 2 is a diagram illustrating an equivalent circuit of one NAND string according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a top-view diagram illustrating a NAND string according to an embodiment of the present invention. FIG. 2 is a diagram illustrating an equivalent circuit thereof. In a flash memory system using the NAND structure, multiple transistors are arranged in series and sandwiched between two select gates, which are referred to as a NAND string. The NAND string depicted in FIGS. 1 and 2 includes four transistors 101~104 coupled in series and sandwiched between a top select gate SG_T (on the drain side) and a bottom select gate SG_B (on the source side). The top select gate SG_T is arranged for connecting the NAND string to a bit line via a bit line contact and may be controlled by applying appropriate voltages to a select gate line SGTL. The bottom select gate SG_B is arranged for connecting the NAND string to a source line and may be controlled by applying appropriate voltages to a select gate line SGBL. Each of the transistors 101~104 includes a control gate and a floating gate. For example, the transistor 101 includes a control gate CG1 and a floating gate FG1, the transistor 102 includes a control gate CG2 and a floating gate FG2, the transistor 103 includes a control gate CG3 and a floating gate FG3, and the transistor 104 includes a control gate CG4 and a floating gate FG4. The control gate CG1 is connected to a word line WL1, the control gate CG2 is connected to a word line WL2, the control gate CG3 is connected to a word line WL3, and the control gate CG4 is connected to a word line WL4.

For illustrative purpose, FIGS. 1 and 2 show four memory cells in the NAND string. In other embodiments, a NAND string may include 8 memory cells, 16 memory cells, 32 memory cells, 64 memory cells, 128 memory cells, etc. However, the number of memory cells in a NAND string does not limit the scope of the present invention.

A typical architecture for a flash memory system using a NAND structure includes several NAND strings. Each NAND string is connected to the source line by its bottom select gate SG_B controlled by the select line SGBL and connected to its associated bit line by its top select gate SG_T controlled by the select line SGTL. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 3:
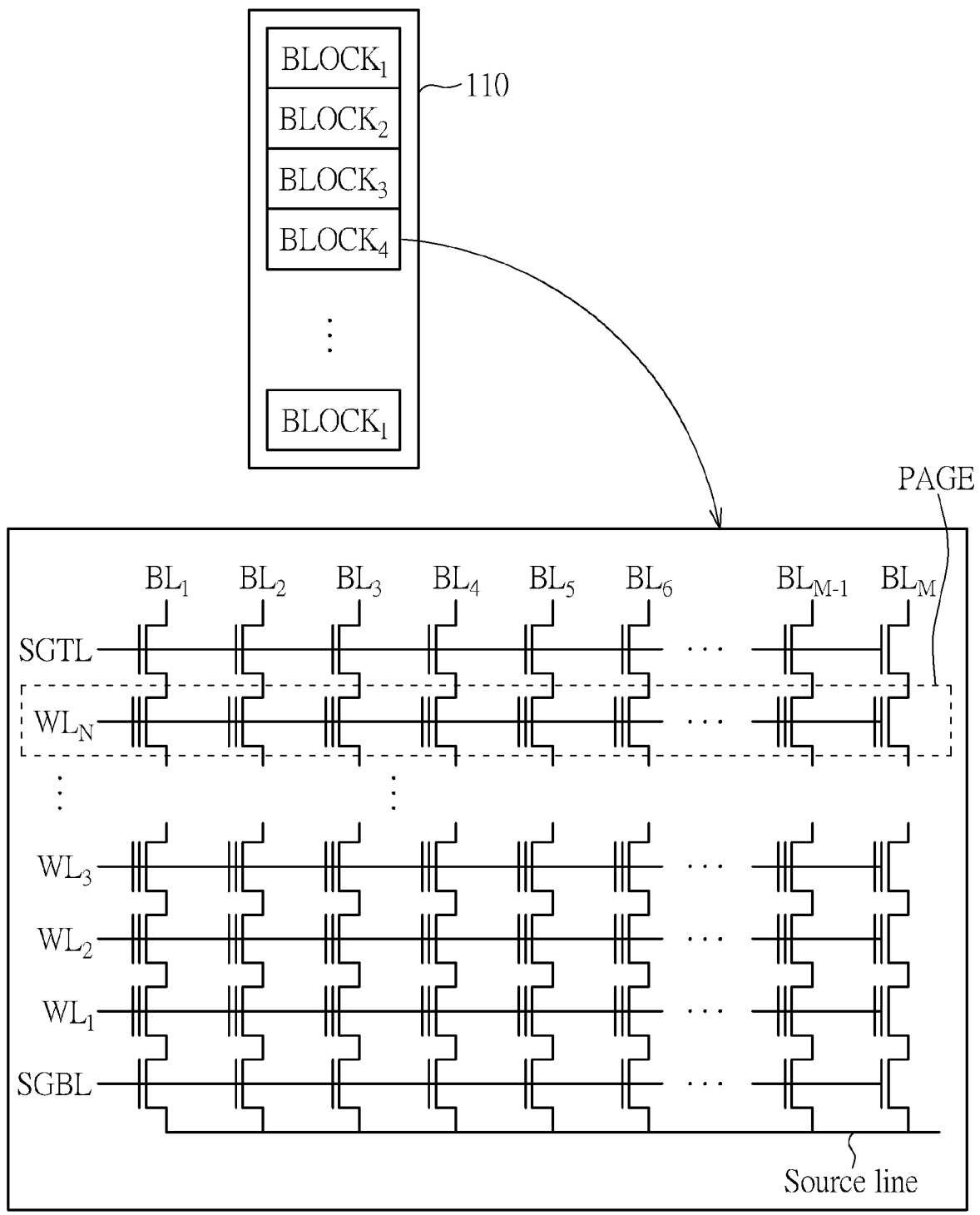
FIG. 3 is a diagram illustrating an exemplary structure of a memory array according to an embodiment of the present invention.

FIG. 3 is a diagram illustrating an exemplary structure of a memory array 110 according to an embodiment of the present invention. The memory array 110 is divided into multiple blocks of memory cells denoted by $BLOCK_1$~$BLOCK_I$, wherein I is a positive integer and typically equal to a large number. A block contains a set of NAND strings which are accessed via bit lines $BL_1$-$BL_M$ and a common set of word lines $WL_1$~$WL_N$, wherein M and N are integers larger than 1. One terminal of the NAND string is connected to a corresponding bit line via the top select gate (connected to the select gate line SGTL), and another terminal is connected to the source line via the bottom select gate (connected to select gate line SGBL). Each block is typically divided into a number of pages as indicated by the dotted lines. In one embodiment, a block is the unit of conventional erase and a page is the unit of conventional programming. However, other units of erase/program can also be used.

Figure 4:
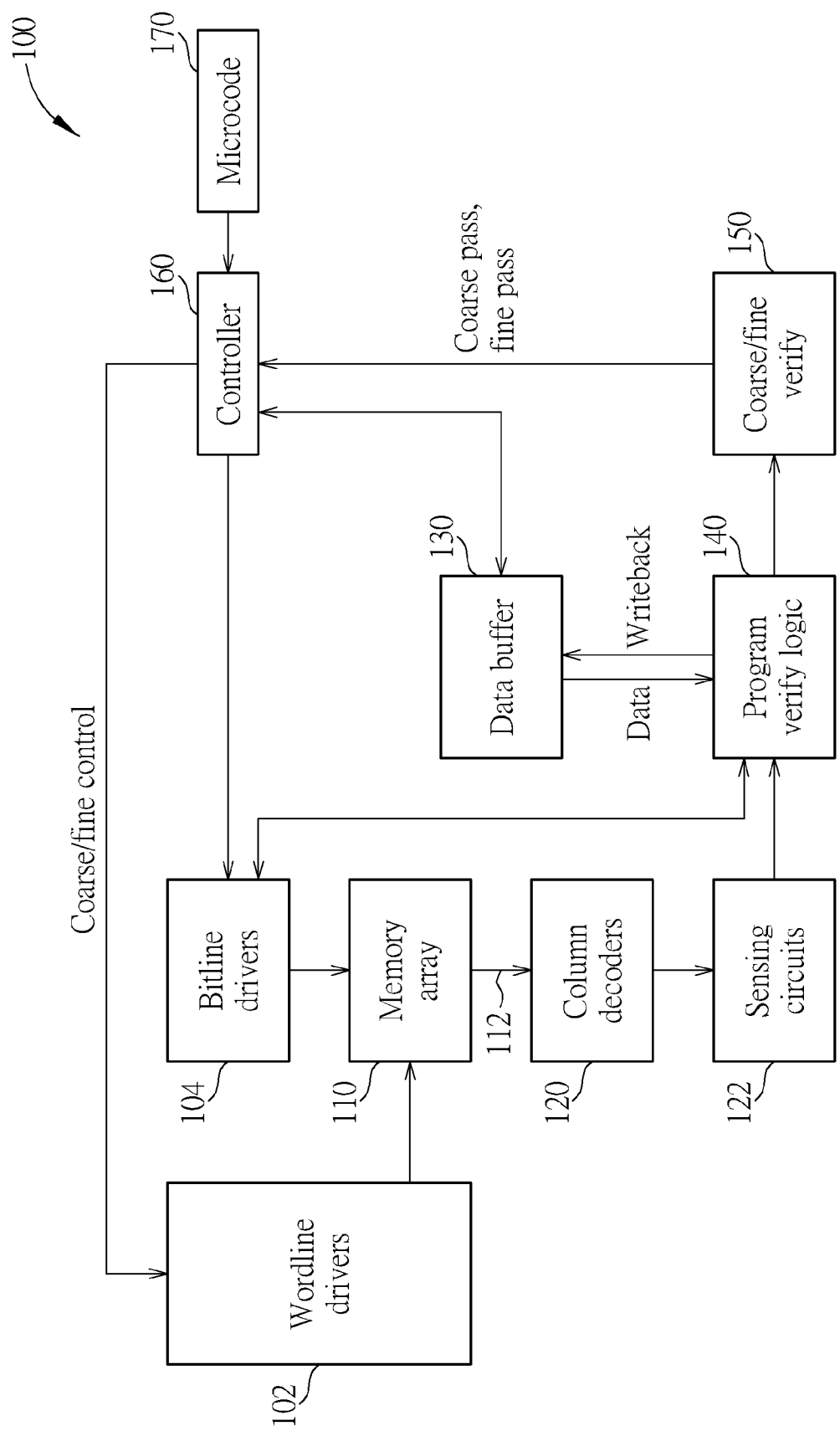
FIG. 4 is a block diagram of a memory device according to an embodiment of the present invention.

FIG. 4 is a block diagram of a memory device 100 according to an embodiment of the present invention. The memory device 100 includes a memory array 110, word line drivers 102, bit line drivers 104, column decoders 120, sensing circuits 122, a data buffer 130, a program verify logic 140, a coarse/fine verify circuit 150, a controller 160, and a microcode 170. The memory array 110 is a nonvolatile memory array that maintains its state when power is removed. For example, the memory array 110 may be a NAND flash memory that includes memory cells having floating gate transistors as depicted in FIGS. 1 and 2. Also, the memory array 110 may be laid in a 3D MLC structure in order to increase data capacity. However, the type of the memory device 100 does not limit the scope of the present invention.

The memory device 100 may include functional blocks and signal lines not shown in FIG. 3. For example, the memory device 100 may include a write interface circuit or a read interface circuit that couples various portions of the memory device 100 to an external bus. Further, the memory device 100 may include signal lines from one or more interface circuits to the controller 160, the data buffer 130, or any other block shown in FIG. 3. The blocks that are shown in FIG. 3 were chosen to support an explanation of various embodiments relating to the programming of the memory array 110.

The controller 160 may be any type of suitable controller capable of effecting programming operations within the memory device 100. For example, the controller 160 may be an embedded microprocessor, a microcontroller, or the like. In operation, the controller 160 is configured to receive and execute software instructions from the microcode 170. The microcode 170 may be held in a nonvolatile memory element, such as a separate flash memory. However, the manner in which the processor 160 and the microcode 170 are implemented does not limit the scope of the present invention.

When programming the memory array 110, data to be programmed is placed in the data buffer 130. In some embodiments, data to be programmed may be placed in the data buffer 130 by the controller 160. Further, a programming operation may program a subset of memory array 110, and data buffer 130 may only hold data to program the subset. During a programming operation, the bit line drivers 104 are configured to supply appropriate voltages to the bit lines within the memory array 110, and the word line drivers 102 are configured to provide programming pulses on the word lines within memory array 110.

In some embodiments, the memory array 110 is a NAND flash memory that includes an array of multilevel memory cells. For example, the memory array 110 laid in a multi-level cell (MLC) structure can store 2 bits per cell, the memory array 110 laid in a triple-level cell (TLC) structure can store 3 bits per cell, and the memory array 110 laid in a quad-level cell (QLC) structure can store 4 bits per cell.

Using the MLC structure for illustrative purposes, each multilevel cell may support four different program states represented by different threshold voltages on a floating gate transistor. These four states may be represented as level zero (L0), level one (L1), level two (L2), and level three (L3), where L0 corresponds to an unprogrammed memory cell with a lowest threshold voltage, L3 corresponds to a programmed memory cell with a highest threshold voltage, and L1 and L2 correspond to programmed memory cells with intermediate threshold voltages. L3, L2, L1, and L0 are also represented as "00," "01," "10," and "11," respectively.

In the MLC embodiment, the data buffer 130 is loaded with values in pairs to be programmed into the memory array 110. For example, because each MLC memory cell may be programmed with two bits of information, the data buffer 130 is loaded with data bits in pairs that represent levels L0, L1, L2, and L3. Since the bits held by the memory cells to be erased are all ones, the MLC memory cells that are to be programmed with L0, or "11," need not be programmed at all. The various embodiments of the present invention recognize that the cells that are to hold "11" need not be programmed, that cells that are to hold "00" may be programmed to a high threshold voltage, and that cells that are to hold "10" or "01" may be programmed to intermediate threshold voltages. The threshold voltages corresponding to the various programmed states are defined to be a sufficient distance from each other so as to allow reliable reading of the MLC memory cells.

In some embodiments, the memory device 100 supports programming MLC cells within memory array 110 using multiple pulses on the word lines where the pulses are at different voltages. Further, the memory device 100 supports incrementing gate voltages on the word lines in coarse steps until the programmed values approach the desired intermediate threshold voltages, and then continuing to increment gate voltages on the word lines in fine steps until the programmed values meet or exceed a pre-determined level. Various programming embodiments utilizing coarse and fine word line voltage steps are described further below. As used herein, the term "coarse pulse" refers to a programming pulse that is applied after a coarse step in word line voltage, and the term "fine pulse" refers to a programming pulse that is applied after a fine step in word line voltage.

During programming, the controller 160 is configured to instruct the bit line drivers 104 to provide appropriate voltages to the bit lines and instruct the word line drivers 102 to provide coarse and fine gate voltages to the word lines. In some embodiments, the controller 160 includes voltage reference circuits for providing the various voltages, and the bit line drivers 104 and the word line drivers 102 include switches for selecting a voltage. In other embodiments, the bit line drivers 104 and the word line drivers 102 include voltage generation circuitry, and the controller 160 provides digital control information to instruct the bit line drivers 104 and the word line drivers 102 to drive various voltages on the bit lines and the word lines. However, the manner in which voltages are generated or routed to the bit lines and the word lines do not limit the scope of the present invention.

The memory array 110 may use one logical path for programming and another logical path for reading/verifying. This allows the paths to be Read While Write (RWW) enabled and allows verification of programming during the programming operation. For example, a current on the data lines 112 may change as the memory cells are programmed. In some embodiments, the word line drivers 102 provide a "sense voltage" on the word lines between programming operations to perform a "verify" operation. Various embodiments of the present invention utilize two different types of verify operations: "coarse verify" and "fine verify." Coarse verify and fine verify are described further below.

During a coarse verify (after a coarse pulse) or during a fine verify (after a fine pulse), the column decoders 120 are configured to receive data from the memory array 110 and direct that data to the sensing circuits 122. The sensing circuits 122 may include one or more reference circuits that provide reference levels to which the data may be compared. For example, the data may be in the form of a current, and the reference circuits may include programmed memory cells that provide reference currents. In some embodiments, multiple references exist for each level. Using the MLC embodiment for illustrative purpose, the sensing circuits 122 may include an L1 coarse reference, an L1 fine verify current, an L2 verify current, an L2 fine verify current, and an L3 verify current.

The program verify logic 140 is configured to compare the output of the sensing circuits 122 with the data from the data buffer 130. For example, during a coarse verify, the sensing circuits 122 generate digital output signals by comparing the output of the column decoders 120 with a coarse verify current, and these digital output signals are compared to the data in the data buffer 130 by the program verify logic 140. In some embodiments, multiple locations within the memory array 110 are programmed simultaneously, and during a verify operation, multiple locations within the memory array 110 are verified simultaneously. For example, the program verify logic 140 may verify 32 locations within memory array 110 simultaneously. Further, in some embodiments, the number of locations programmed simultaneously within the memory array 110 may be variable based on the communication bandwidth of various buses, or the current capability of a program pump within the memory device 100.

The coarse/fine verify circuit 150 receives information from the program verify logic 140 and provides information to the controller 160. During a coarse verify operation, the coarse/fine verify circuit 150 is configured to detect if any of the memory cells being programmed has exceeded the corresponding coarse reference, and if so, asserts the "coarse pass" signal to the controller 160. Using the MLC embodiment for illustrative purpose, a coarse verify operation is performed on all memory cells currently being programmed with either L1 or L2. In these embodiments, if even one memory cell exceeds the corresponding coarse reference, the coarse/fine verify circuit 150 will assert the coarse pass signal. By asserting the coarse pass signal, the coarse/fine verify circuit 150 may inform the controller 160 to switch from coarse gate voltage steps to fine gate voltage steps.

After receiving a coarse pass signal, the controller 160 is configured to instruct the word line drivers 102 to provide fine gate voltage steps on the word lines within the memory array 110. During a fine verify operation (after a fine pulse), the sensing circuits 122 may compare the output of the column decoders 120 with corresponding fine verify current. Using the MLC embodiment for illustrative purpose, data in a location being programmed with L1 is compared to an L1 fine verify current, and data in a location being programmed with L2 is compared to an L2 fine verify current. Also during a fine verify operation, the program verify logic 140 may compare the output of sensing circuits 122 and data from data buffer 130. For locations that meet or exceed the corresponding fine verify current, the program verify logic 140 is configured to writes a pass data, such as "11", in the data buffer 130 for indicating that a corresponding memory cell has passed the fine verify operation. For locations that do not meet or exceed the corresponding fine verify current, the program verify logic 140 does not change the data in the data buffer 130. Fine pulses are then repeated, but not for those locations that have met or exceeded the fine verify current because the data in data buffer 130 corresponding to those locations is now "11." The "fine pass" signal is asserted only when all memory cells being programmed have been programmed correctly.

Figure 5:
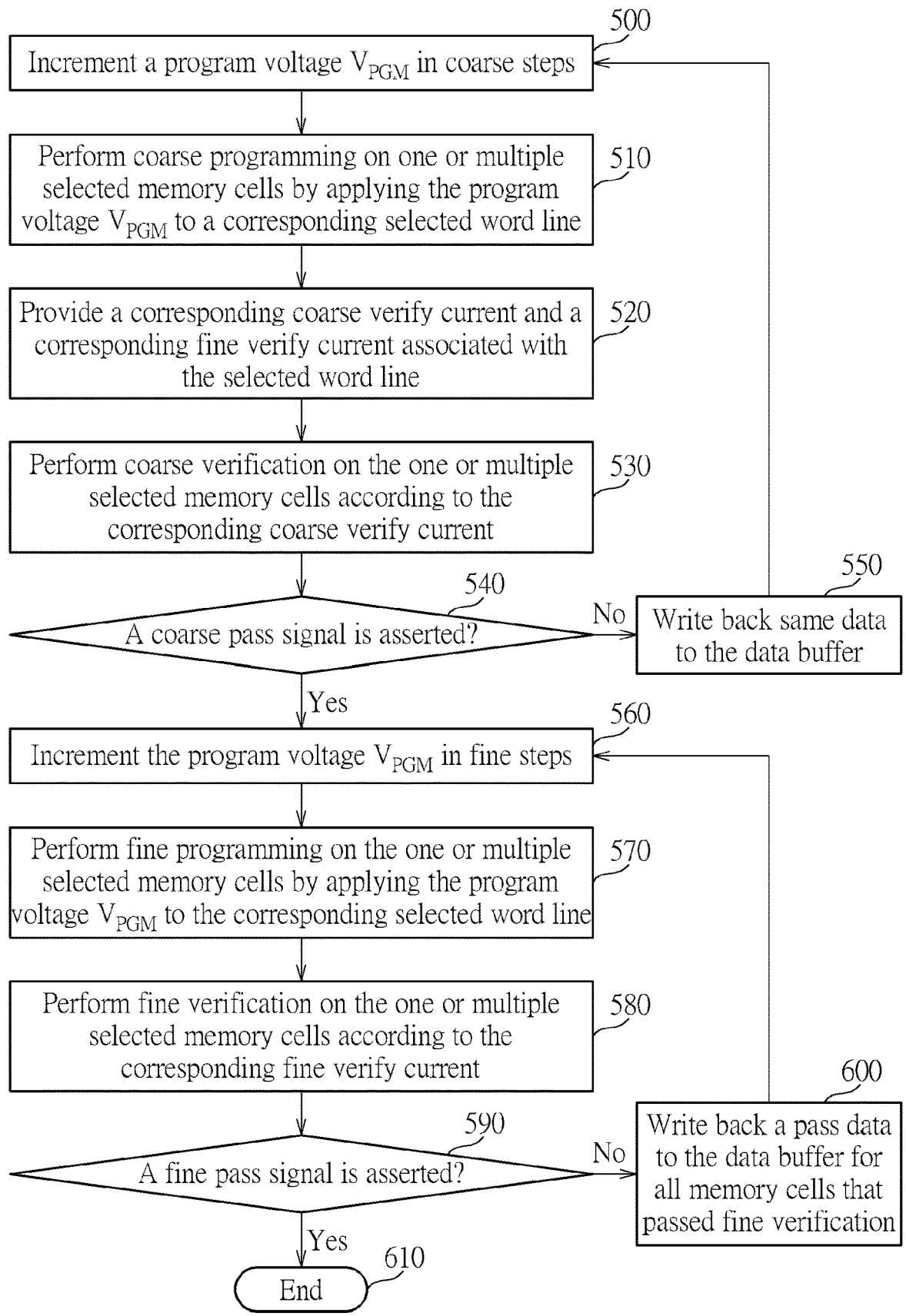
FIG. 5 is a flowchart illustrating a method of programming a memory array in a memory device according to an embodiment of the present invention.

FIG. 5 is a flowchart illustrating a method of programming and verifying the memory array 110 in the memory device 100 according to an embodiment of the present invention. The flowchart in FIG. 5 includes the following steps:

Step 500: increment a program voltage VPGM in coarse steps.

Step 510: perform coarse programming on one or multiple selected memory cells by applying the program voltage VPGM to a corresponding selected word line.

Step 520: provide a corresponding coarse verify current and a corresponding fine verify current associated with the selected word line.

Step 530: perform coarse verification on the one or multiple selected memory cells according to the corresponding coarse verify current.

Step 540: determine whether a coarse pass signal is asserted; if yes, execute step 560; if not, execute step 550.

Step 550: write back same data to the data buffer; execute step 500.

Step 560: increment the program voltage $V_{PGM}$ in fine steps.

Step 570: perform fine programming on the one or multiple selected memory cells by applying the program voltage $V_{PGM}$ to the corresponding selected word line.

Step 580: perform fine verification on the one or multiple selected memory cells according to the corresponding fine verify current.

Step 590: determine whether a fine pass signal is asserted; if yes, execute step 610; if not, execute step 600.

Step 600: write back a pass data to the data buffer for all memory cells that passed fine verification; execute step 610.

Step 610: end.

In steps 500 and 560, the controller 160 is configured to instruct the word line drivers 102 to apply the programming voltage $V_{PGM}$ which may be a series of programming voltage pulses in the form of a staircase waveform starting from an initial voltage level. The memory cell under programming is subject to this series of programming voltage pulses, with an attempt each time to add incremental charges to its floating gate.

Figure 6:
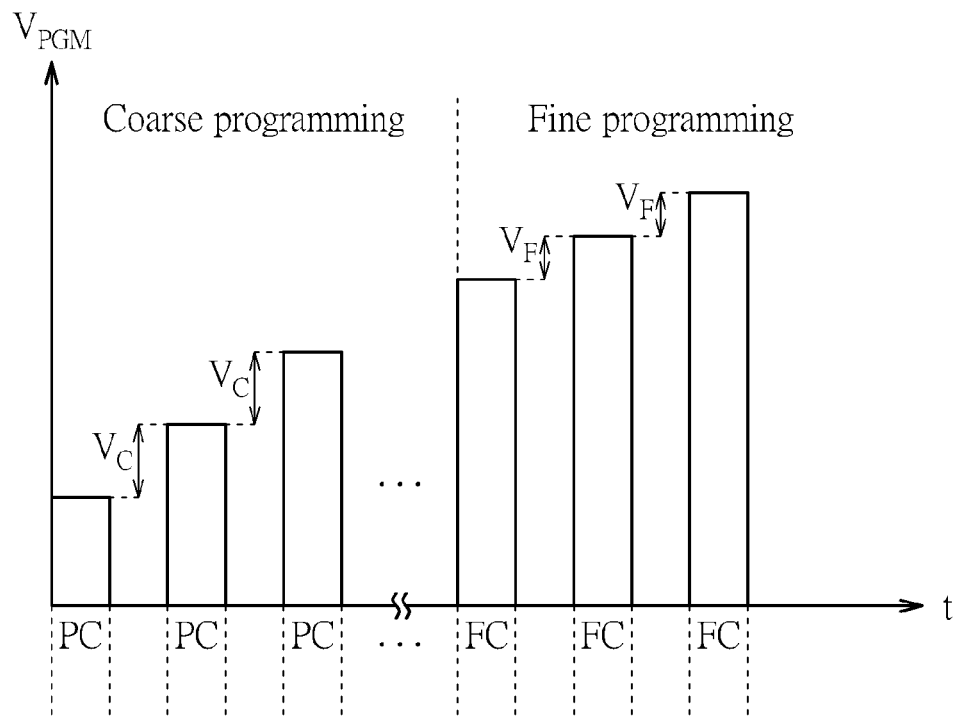
FIG. 6 is a diagram illustrating the waveform of the programming voltage when programming a memory array in a memory device according to an embodiment of the present invention.

FIG. 6 is a diagram illustrating the waveform of the programming voltage $V_{PGM}$ when executing steps 500 and 560 according to an embodiment of the present invention. In step 500, the programming voltage $V_{PGM}$ is incremented in coarse steps during each coarse program period PC. More specially, the level of the programming voltage $V_{PGM}$ is incremented by an amount of $V_C$ (coarse pulses) at the start of each coarse program period PC. In step 560, the programming voltage $V_{PGM}$ is incremented in fine steps during the program periods PF1. More specially, the level of the programming voltage $V_{PGM}$ is incremented by an amount of $V_F$ (fine pulses) at the start of each fine program period FC, wherein $V_F < V_C$.

In step 510, coarse programming may be performed on one or multiple selected memory cells by applying the program voltage $V_{PGM}$ (coarse pulses) to a corresponding selected word line during one or multiple coarse program period PC. In step 570, fine programming may be performed on one or multiple selected memory cells by applying the program voltage $V_{PGM}$ (fine pulses) to a corresponding selected word line during one or multiple fine program period FC. Each pulse adds incremental charges to the one or multiple selected memory cells with a goal to reach one or multiple program states stored in the data buffer 130.

In step 520, the sensing circuits 122 may include one or more reference circuits that provide reference levels based on which coarse verification and fine verification may be conducted. For example, the data may be in the form of a current, and the reference circuits may include programmed memory cells that provide reference currents. In some embodiments, multiple references exist for each programmed level. Using the MLC embodiment for illustrative purpose, the sensing circuits 122 may provide an L1 coarse verify current, an L1 fine verify current, an L2 coarse verify current, an L2 fine verify current, and an L3 verify current.

In the present invention, the value of each coarse verify current may be adjusted according to the sequence of programming the word lines. The common set of word lines $WL_1 \sim WL_N$ is further grouped in P word line subsets $SUB_1 \sim SUB_P$, wherein each word line subset includes n adjacent word lines (n is a positive integer smaller than N). First, the word lines $WL_1 \sim WL_n$ in the first word line subset $SUB_1$ are sequentially programmed, followed by sequentially programming the word lines $WL_{n+1} \sim WL_{2n}$ in the second word line subset $SUB_2$. The same procedure continues until the word lines $WL_{N-n+1} \sim WL_N$ in the $P^{th}$ word line subset are sequentially programmed.

Figure 7:
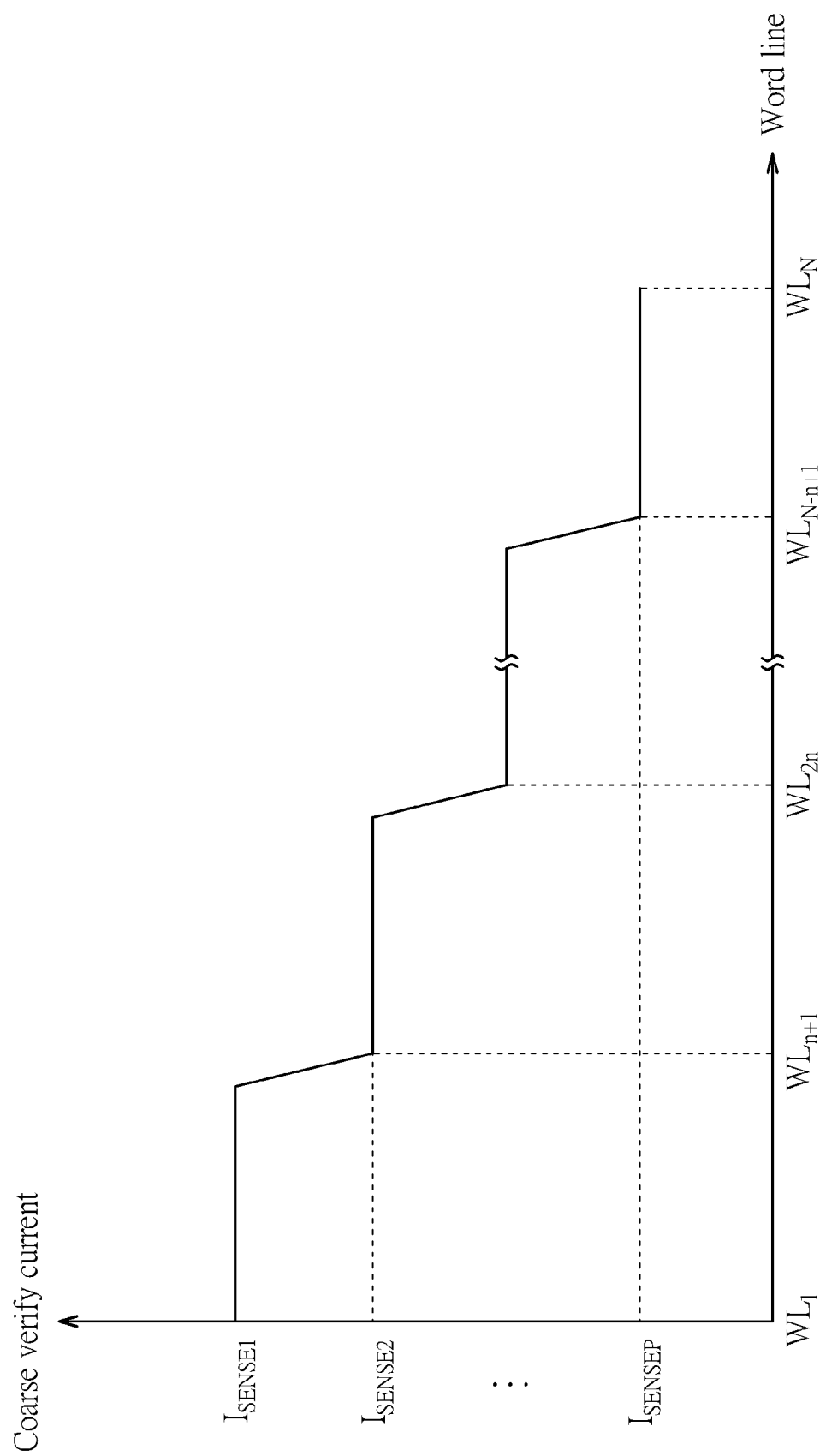
FIG. 7 is a diagram illustrating the value of the coarse verify current associated with each word line subset according to an embodiment of the present invention.

FIG. 7 is a diagram illustrating the value of the coarse verify current associated with each word line subset. As depicted, if a selected memory cell controlled by a word line in the first word line subset $SUB_1$ is to be programmed to L1, the corresponding coarse verify current is set to $I_{SENSE1}$; if a selected memory cell controlled by a word line in the second word line subset $SUB_2$ is to be programmed to L1, the corresponding coarse verify current is set to $I_{SENSE2}$; . . . ; if a selected memory cell controlled by a word line in the $P^{th}$ word line subset $SUB_P$ is to be programmed to L1, the corresponding coarse verify current is set to $I_{SENSEP}$, wherein $I_{SENSE1} > I_{SENSE2} > \ldots > I_{SENSEP}$. In other words, the coarse verify current associated with a word line subset which has been programmed to L1 at a later time is set to a smaller value than the coarse verify current associated with a word line subset which has been programmed to L1 at an earlier time.

In steps 530 and 580, coarse/fine verification may be performed on the one or multiple selected memory cell by reading back the memory cell. The read back process may involve one or more sensing operation by applying verify voltages $V_{VER}$ in between the programming pulses.

Figure 8:
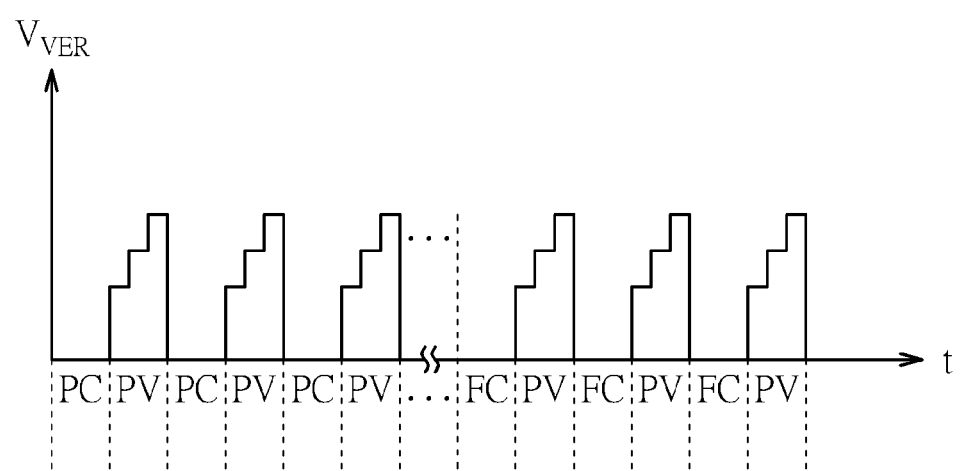
FIG. 8 is a diagram illustrating the waveform of the verify voltages when programming a memory array in a memory device according to an embodiment of the present invention.

FIG. 8 is a diagram illustrating the waveform of the verify voltages $V_{VER}$ when executing steps 530 and 580 according to an embodiment of the present invention. With reference to FIG. 6, each verify period PV is inserted between two adjacent program period for confirming the current voltage level of the one or multiple selected memory cell.

In steps 540 and 590, the column decoders 120 may receive data from the memory array 110 during each verify period and direct that data to the sensing circuits 122. The sensing circuits 122 may compare the data from the memory array 110 with the corresponding coarse/fine verify current.

In step 540, if none of the memory cells being programmed has exceeded the corresponding coarse verify current, the program verify circuit 140 writes the same data back to the data buffer 130 in step 550. In another embodiment, step 550 may be omitted, and the method directly loops back to step 500 after the "no" determination in step 540. The above-mentioned loop aims at adding incremental charges to the one or multiple selected memory cell until at least one of the memory cells being programmed has exceeded the corresponding coarse verify current.

If any of the memory cells being programmed has exceeded the corresponding coarse reference, the coarse/fine verify circuit 150 asserts the "coarse pass" signal to the controller 160, resulting in the "yes" determination in step 540. Using the MLC embodiment for illustrative purpose, a coarse verify operation is performed on all memory cells currently being programmed with either L1 or L2. In these embodiments, if any memory cell exceeds the corresponding coarse reference, the coarse/fine verify circuit 150 will assert the coarse pass signal. By asserting the coarse pass signal, the coarse/fine verify circuit 150 may inform the controller 160 to increment the program voltage $V_{PGM}$ in fine steps in step 560.

If at least one of the memory cells being programmed has not exceeded the corresponding fine verify current, the fine pass signal is not asserted, resulting in the "no" determination in step 590. Under such circumstance, the program verify circuit 140 writes the indication data to the data buffer 130 for all memory cells that passed the fine verify (exceeded the corresponding fine verify current) in step 600. Next, the method directly loops back to step 560. The indication data, such as "11" in the MLC configuration, prevents all memory cells that have passed the fine verify to be re-pulsed. The above-mentioned loop aims at adding incremental charges to the one or multiple selected memory cells until all of the memory cells being programmed have exceeded the corresponding fine verify current.

In the present invention, coarse and fine programming may be adopted to improve overall programming speed. Also, a coarse/fine verify is performed according to a corresponding coarse/fine verify current after each step of coarse/fine programming to determine whether the selected memory cell has reached a desired value. The value of each coarse verify current may be adjusted according to the sequence of programming the word lines, thereby compensating for the gain variations among different memory cells. Therefore, the present method can provide a large margin on the threshold voltages of the memory cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
 a memory array including a plurality of memory cells;
 a plurality of bit lines coupled to the plurality of memory cells;
 a column decoder coupled to the plurality of bit lines;
 a sensing circuit coupled to the column decoder;
 a plurality of word lines coupled to the plurality of memory cells; and
 a controller coupled the column decoder, and the sensing circuit, and the controller is configured to:
 instruct the column decoder to:
  receive a first data current from a first selected memory cell through a first bit line of the bit lines coupled to the first selected memory cell and receive a second data current from a second selected memory cell through a second bit line of the bit lines coupled to the second selected memory cell; and
 instruct the sensing circuit to:
  compare the first data current with a verify current; and
  compare the second data current with the verify current, and the verify current is configured to be adjusted according to a sequence of programming the word lines, wherein the verify current associated with a later programmed word line is configured to be smaller than that associated with an earlier programmed word line.

2. The memory device of claim 1, further comprising a word line driver coupled to the plurality of word lines; wherein the controller is coupled to the word line driver and configured to instruct the word line driver to:
 apply a first program voltage to a first word line of the plurality of word lines coupled to a first selected memory cell of the plurality of memory cells, wherein the first program voltage is incremented by a first amount;
 apply a first verify voltage to the first word line between two adjacent program voltage pulses;
 in response to a voltage of the first selected memory cell fails to pass the first verify voltage, apply the first program voltage incremented with the first amount until the first selected memory cell passes the first verify voltage;
 in response to a voltage of the first selected memory cell passes the first verify voltage, apply a second program voltage to the first word line after applying the first program voltage, wherein the second program voltage is incremented by a second amount smaller than the first amount;
 apply the first program voltage to a second word line of the word lines coupled to a second selected memory cell of the memory cells; and
 apply a second verify voltage to the second word line between the two adjacent program voltage pulses; wherein
 apply the second program voltage to the first word line after applying the first program voltage further comprises:
 apply the second program voltage incremented with the second amount until the second selected memory cell passes the second verify voltage.

3. The memory device of claim 2, wherein each of the first and second program voltages comprises a series of programming voltage pulses incremented by the respective first or second amount, and wherein the series of programming voltage pulses is in a form of a staircase waveform starting from an initial voltage level.

4. The memory device of claim 3, wherein the initial voltage level of the second program voltage is larger than the initial voltage level of the first program voltage.

5. A memory device, comprising:
 a memory array including a plurality of memory cells;
 a plurality of word lines and a plurality of bit lines coupled to the plurality of memory cells;
 a column decoder coupled to the bit lines;
 a sensing circuit coupled to the column decoder; and
 a controller coupled the column decoder, and the sensing circuit, and configured to:
 instruct the column decoder to:
  receive a first data current from a first selected memory cell of the memory cells through a first bit line of the bit lines coupled to the first selected memory cell and receive a second data current from a second selected memory cell of the memory cells through a second bit line of the bit lines coupled to the second selected memory cell; and instruct the sensing circuit to:

compare the first data current with a verify current; and compare the second data current with the verify current, and the verify current is configured to be adjusted according to a sequence of programming the word lines, wherein the verify current associated with a later programmed word line is configured to be smaller than that associated with an earlier programmed word line.

6. The memory device of claim 5, further comprising a word line driver coupled to the word lines, wherein the controller is coupled to the word line driver and is further configured to:

instruct the word line driver to:

apply a first program voltage to a first word line of the word lines coupled to the first selected memory cell of the memory cells and apply the first program voltage to a second word line of the word lines coupled to the second selected memory cell of the memory cells;

apply a second program voltage to the first word line of the word lines coupled to the first selected memory cell of the memory cells after applying the first program voltage to the first word line; and apply the second program voltage to the second word line of the word lines coupled to the second selected memory cell of the memory cells;

instruct the column decoder to:

receive a third data current from the first selected memory cell through the first bit line of the bit lines coupled to the first selected memory cell and receive a fourth data current from the second selected memory cell through the second bit line of the bit lines coupled to the second selected memory cell; and instruct the sensing circuit to:

compare the third data current with the verify current; and compare the fourth data current with the verify current.

7. The memory device of claim 6, wherein the verify current comprises a first verify current associated with the first word line programmed by the first program voltage, and a second verify current associated with the second word line programmed by the first program voltage, and the second verify current is smaller than the first verify current.

8. The memory device of claim 7, wherein the first program voltage is incremented by a first amount, and the second program voltage is incremented by a second amount smaller than the first amount, and each of the first and second program voltages comprises a series of programming voltage pulses incremented by the respective first or second amount.

9. The memory device of claim 8, wherein the series of programming voltage pulses is in a form of a staircase waveform starting from an initial voltage level.

10. The memory device of claim 9, wherein the initial voltage level of the second program voltage is larger than the initial voltage level of the first program voltage.

11. The memory device of claim 8, wherein the controller is further configured to instruct the word line driver to apply a verify voltage to the respective first or second selected word line between two adjacent program voltage pulses.

12. A method for operating a memory device, the memory device comprising a memory array including a plurality of memory cells, the method comprising:

programming a first selected memory cell of the plurality of memory cells;

verifying the programmed first selected memory cell based on a verify current;

programming a second selected memory cell of the plurality of memory cells after programming the first selected memory cell; and verifying the programmed second selected memory cell based on the verify current, wherein the verify current is configured to be adjusted according to a sequence of programming selected memory cells, wherein the verify current associated with a later programmed word lines is configured to be smaller than that associated with an earlier programmed word lines.

13. The method of claim 12, wherein the verify current comprises a first verify current associated with the first selected memory cell programmed by a first program voltage, and a second verify current associated with the second selected memory cell programmed by a second program voltage, and the second verify current is smaller than the first verify current.

14. The method of claim 13, wherein the memory device further comprises a plurality of word lines coupled to the plurality of memory cells and divided into a plurality of subsets;

the first selected memory cell is coupled to a first word line in a first subset of the plurality of subsets; and the second selected memory cell is coupled to a second word line in a second subset of the plurality of subsets, and the method further comprises:

programming a third selected memory cell of the plurality of memory cells coupled to a third word line in the first subset; and verifying the programmed third selected memory cell based on the verify current.

15. The method of claim 14, wherein verifying the programmed first or second selected memory cell comprises:

applying a verify voltage to the respective first or second word line;

receiving a respective data current from the first or second selected memory cell; and compare the respective data current with the verify current.

16. The method of claim 14, wherein programming the first or second selected memory cell comprises:

applying the first program voltage to the respective first or second word line, wherein the first program voltage is incremented by a first amount; and applying the second program voltage to the respective first or second word line, wherein the second program voltage is incremented by a second amount smaller than the first amount.

* * * * *